US006969571B2

(12) United States Patent
Noudo et al.

(10) Patent No.: US 6,969,571 B2
(45) Date of Patent: Nov. 29, 2005

(54) EXPOSURE METHOD USING COMPLEMENTARY DIVIDED MASK, EXPOSURE APPARATUS, SEMICONDUCTOR DEVICE, AND METHOD OF PRODUCING THE SAME

(75) Inventors: Shinichiro Noudo, Kanagawa (JP); Kumiko Oguni, Kanagawa (JP); Hiroyuki Nakano, Kanagawa (JP); Hiroki Hane, Kanagawa (JP)

(73) Assignee: Sony Corporation, Tokyo (JP)

( * ) Notice: Subject to any disclaimer, the term of this patent is extended or adjusted under 35 U.S.C. 154(b) by 73 days.

(21) Appl. No.: 10/467,385

(22) PCT Filed: Nov. 29, 2002

(86) PCT No.: PCT/JP02/12505

§ 371 (c)(1),
(2), (4) Date: Jul. 28, 2003

(87) PCT Pub. No.: WO03/046963

PCT Pub. Date: Jun. 5, 2003

(65) Prior Publication Data

US 2004/0072086 A1    Apr. 15, 2004

(30) Foreign Application Priority Data

Nov. 30, 2001   (JP) ............................. 2001-366326

(51) Int. Cl.⁷ ............................. G03F 9/00; G03C 5/00
(52) U.S. Cl. ............................. 430/22; 430/5; 430/30; 430/296; 430/942
(58) Field of Search ............................. 430/5, 22, 30, 430/296, 942

(56) References Cited

U.S. PATENT DOCUMENTS

| | | | |
|---|---|---|---|
| 4,169,230 A | | 9/1979 | Bohlen et al. |
| 5,831,272 A | | 11/1998 | Utsumi |
| 2001/0031407 A1 | | 10/2001 | Okino et al. |
| 2004/0081897 A1 | * | 4/2004 | Koike ........................... 430/5 |

FOREIGN PATENT DOCUMENTS

| | | |
|---|---|---|
| EP | 0807854 A1 | 11/1997 |
| JP | 54-41076 | 3/1979 |
| JP | 08-339957 | 12/1996 |
| JP | 09-306811 | 11/1997 |
| JP | 10-335243 | 12/1998 |
| JP | 29-51947 | 9/1999 |
| JP | 2001-319872 | 11/2001 |

* cited by examiner

Primary Examiner—Christopher G. Young
(74) Attorney, Agent, or Firm—Robert J. Depke; Trexler, Bushnell, Giangiorgi, Blackstone & Marr

(57) ABSTRACT

To provide an exposure method and an exposure apparatus, using a complementary divided mask, designed to enable alignment of a complementary divided mask at a high precision over the entire region of a semiconductor wafer. Further, to provide a semiconductor device fabricated by the exposure method and a method of producing a semiconductor device using the exposure method. In a first region at a middle portion of a semiconductor wafer, the complementary divided mask is aligned by die-by-die alignment method based on detection results of positions of alignment marks provided at the respective chips and the regions are exposed, while in a second region, outside of the first region, where alignment on the complementary divided mask by die-by-die alignment method cannot be used, coordinates of the respective chip in the second region are decided by global alignment method based on detection results of positions of alignment marks detected in the first step and the complementary divided mask is aligned and the regions are exposed.

11 Claims, 13 Drawing Sheets

EXPOSURE METHOD USING COMPLEMENTARY DIVIDED MASK, EXPOSURE APPARATUS, SEMICONDUCTOR DEVICE, AND METHOD OF PRODUCING THE SAME

This application claims priority to Japanese Patent Application Number JP2001-366326, filed Nov. 30, 2001, which is incorporated herein by reference.

TECHNICAL FIELD

The present invention relates to an exposure method using a complementary divided mask for production of a semiconductor device, an exposure apparatus, a semiconductor device, and a method of producing the same.

BACKGROUND ART

In production processes of a semiconductor device, when patterning, photolithographic processing is frequently used. In a conventional patterning, the photolithographic processing is carried out on a semiconductor wafer using a transfer mask (reticle).

In fabrication of the transfer mask (reticle) used in the photolithographic processing, first a resist film is formed on a chromium film formed on a silica-based substrate. Next, the resist film is exposed by light or an electron beam based on design data, then developed to form a resist mask having a predetermined pattern. Then, the chromium film is etched using the resist mask as a etching mask to form pattern aperture and thereby fabricate the desired transfer mask.

However, with patterning processes by photolithographic processing using the transfer mask, it is becoming more difficult to handle the formation of fine patterns along with miniaturization of semiconductor devices.

That is, along with the improvement in the degree of the integration of LSIs, lithographic technology enabling finer processing has being demanded. To respond to this, next generation electron-beam lithographic technology such as LEEPL (Low Energy E-beam Proximity Projection Lithography) and EPL is being developed.

In next generation electron-beam lithographic technology, instead of a transfer mask comprised of the above-mentioned silica-based substrate, a stencil mask fabricated by directly forming pattern apertures in a membrane consisting of Si, diamond, or the like based on design data is being used.

However, with a stencil mask, since pattern apertures are directly formed in the membrane region to form the pattern, it is physically impossible to fabricate for example a doughnut-shaped (annular-shaped) pattern. Namely, it is not possible to support the membrane at the inside.

Therefore, "a complementary divided technology" using a complementary stencil mask dividing a single pattern into two or more blocks and performing overlay exposure on a semiconductor wafer is being developed. For example, when forming a doughnut-shaped pattern, two mask regions having pattern apertures dividing the doughnut-shaped pattern into halves are formed based on design data of the doughnut-shaped pattern. Then, the patterns of the mask regions are exposed overlapped to transfer the doughnut-shaped pattern on the semiconductor wafer.

Here, in the present description, a "stencil mask" is defined as a mask having aperture regions where substance does not exist in a space.

A "complementary divided mask" is defined as a mask dividing a pattern of a certain section and placing the parts on different mask region and able to form the pattern of that section as before division by making the mask regions overlap to make divided parts of the pattern overlap.

A "complementary divided stencil mask" is defined as a stencil mask dividing a pattern of a certain section and placing the parts on different mask region and able to form the pattern of that section as before division by making the mask region overlap to make divided parts of the pattern overlap.

In the lithographic technology using proximity exposure such as the above LEEPL, control of the gap between the mask and the semiconductor wafer is important.

In LEEPL, to control the gap, for example, the SLA alignment method developed by Sumitomo Heavy Industries Co., Ltd. and actually used in equal magnification X-ray lithography is employed.

The SLA alignment method is die-by-die alignment method which simultaneously detects marks and signals on complementary divided stencil masks for the respective drawing regions. Due to this, it measures and controls the relative positions of the semiconductor wafer and the complementary divided stencil masks and the gap between the semiconductor wafer and the complementary divided stencil masks.

The masks are aligned by die-by-die alignment method or global alignment method.

Die-by-die alignment method is a method measuring the positions of alignment marks formed at a previous step on a semiconductor wafer for the respective shots and using these to align the masks and determine the exposure position. This method can even handle expansion and contraction differing by location on the semiconductor wafer and promises a high alignment precision.

On the other hand, global alignment method is a method first measuring the positions of alignment marks of a plurality of points on a semiconductor wafer to determine the coordinates of the respective shots in the semiconductor wafer and moving and exposing the semiconductor wafer according to the coordinates. To use this method, a means for accurately measuring the coordinate position of the semiconductor wafer is necessary.

However, with die-by-die alignment method, as explained below, there was the problem of a difficulty of control of the relative positions of the complementary divided stencil masks and the semiconductor wafer. Control of the relative positions of the complementary divided stencil masks and a semiconductor wafer is called "alignment".

For example, consider the case of exposure using equal magnification transfer type complementary four-divided stencil masks as shown in FIG. 1. As shown in FIG. 1, the equal magnification transfer type complementary four-divided stencil masks 10 divide a single pattern into four different patterns. First to fourth masks 10A to 10D the respective having one of the four different patterns are connected to form a single mask.

When using the complementary four-divided stencil mask 10 to expose a semiconductor wafer, it is possible to alternately use the first to fourth masks 10A to 10D to expose a single chip region to transfer a single pattern to the chip region.

The method of alignment of the complementary four-divided stencil masks by die-by-die alignment method will be described next. Generally, as shown in FIG. 2, alignment is performed using alignment marks 16 provided at the four corners of a set of four chips of a semiconductor wafer 12 corresponding to the size of the complementary divided mask, that is, the four chip region 14. Note that a "chip region" indicates a region corresponding to one semiconductor chip. Further, in the illustrated example, the four chips regions correspond to a scan area of an electron beam in a single exposure, that is, a single exposure region or exposure field.

At that time, as shown in FIG. 2, exposure regions including chip regions 18 (chip regions marked X in FIG. 2) at the outer circumference portion of the semiconductor wafer lack one or more of the necessary alignment marks, so alignment of the complementary divided stencil mask is not possible.

Further, although aligning by global alignment method is possible, since the average of the entire semiconductor wafer is taken to calculate the alignment coefficients, there was the problem that higher order distortion of the underlying semiconductor wafer could not be corrected.

In this way, due to the problem in the alignment of complementary divided stencil masks, it is difficult to use complementary divided stencil masks to accurately transfer a desired pattern to a semiconductor.

DISCLOSURE OF THE INVENTION

An object of the present invention is to provide an exposure method using complementary divided mask able to align complementary divided mask at a high accuracy over the entire region of a semiconductor wafer.

Another object of the present invention is to provide an exposure apparatus able to align complementary divided mask at a high accuracy over the entire region of a semiconductor wafer.

Still another object of the present invention is to provide a semiconductor device fabricated by the above exposure method and having patterns transferred to it accuracy.

Still another object of the present invention is to provide a method of producing a semiconductor device using the above exposure method.

To achieve the above object, the exposure method of the present invention comprises a first step for detecting positions of alignment marks provided at the respective exposure objective unit regions, aligning the complementary divided masks based on the detected positions of alignment marks, and exposing the respective exposure objective unit regions in a first region including a plurality of exposure objective unit regions at a middle portion of a semiconductor wafer, and a second step for determining coordinates of exposure objective regions in a second region, outside of the first region, where alignment of the complementary divided masks by detection of alignment marks cannot be used, aligning the complementary divided masks based on the positions of alignment marks detected in the first step, and exposing regions in the second region.

Further, to achieve the above object, the exposure apparatus of the present invention comprises a position control part for controlling relative positions of a complementary divided mask and a semiconductor wafer, an alignment mark detection means for detecting positions of alignment marks provided at the respective exposure objective unit regions of the semiconductor wafer, and an exposure optical system for irradiating an exposure beam to the semiconductor wafer via the complementary divided mask, wherein the position control part controls the relative positions based on the positions of alignment marks of the respective exposure objective unit regions detected by the alignment mark detection means in an exposing process of a first region including a plurality of the exposure objective unit regions in the middle portion of a semiconductor wafer and determines the coordinates of the respective exposure objective unit regions in the second region, outside of the first region, where alignment of the complementary divided mask by detection of alignment marks cannot be used and controls the relative positions based on the detected positions of the alignment marks in exposure of the second region.

Further, to achieve the above object, the semiconductor device of the present invention is formed by an exposure process including a first step for detecting positions of alignment marks provided at the respective exposure objective unit regions, aligning a complementary divided mask based on the detected positions of alignment mark, and exposing the respective exposure objective unit regions in a first region including a plurality of exposure objective unit region in a middle portion of a semiconductor wafer, and a second step for determining the coordinates of exposure objective regions in a second region, outside of the first region, where alignment of the complementary divided mask by detection of the alignment cannot be used, based on the positions of the alignment marks detected at the first step in the second region, aligning the complementary divided mask, and exposing regions.

Further, to achieve the above object, the method of producing a semiconductor device of the present invention comprises an exposure step using a complementary divided mask having a first step for detecting positions of alignment marks provided at the respective exposure objective unit regions, aligning a complementary divided mask based on the detected positions of alignment marks, and exposing the respective exposure objective unit regions in a first region including a plurality of exposure objective unit regions at a middle portion of a semiconductor wafer, and a second step for determining the coordinates of exposure objective regions in a second region, outside of the first region, where alignment of the complementary divided mask by detection of the alignment marks cannot be used, based on the positions of alignment marks detected at the first step in the second region, aligning the complementary divided mask, and exposing regions.

BRIEF DESCRIPTION OF THE DRAWINGS

FIG. 5A is a view of selective use of die-by-die alignment method and global alignment method depending on the thermal expansion in a semiconductor wafer and the elapse time, while

BEST MODE FOR CARRYING OUT THE INVENTION

Preferred embodiment of the present invention will be described with reference to the accompanying drawings.

First Embodiment

The present embodiment is an example of application of an exposure method using complementary divided masks according to the present invention to exposure using equal magnification transfer type complementary four-divided masks for LEEPL of electron beam transfer lithography. FIG. 3A to FIG. 3E are plane views of semiconductor wafers for explaining the procedure of alignment of complementary four-divided stencil masks and exposure of regions of the present embodiment.

Here, in the present description, a "stencil mask" is defined as a mask having aperture regions where substance dose not exist in a space.

A "complementary divided mask" is defined as a mask dividing a pattern of a certain section and placing the parts on different mask region and able to form the pattern of that section as before division by making the mask regions overlap to make divided part of the pattern overlap.

A "complementary divided stencil mask" is defined as a stencil mask dividing a pattern of a certain section and placing the parts on different mask region and able to form the pattern of that section as before division by making the mask regions overlap to make divided part of the pattern overlap.

Figure 1:
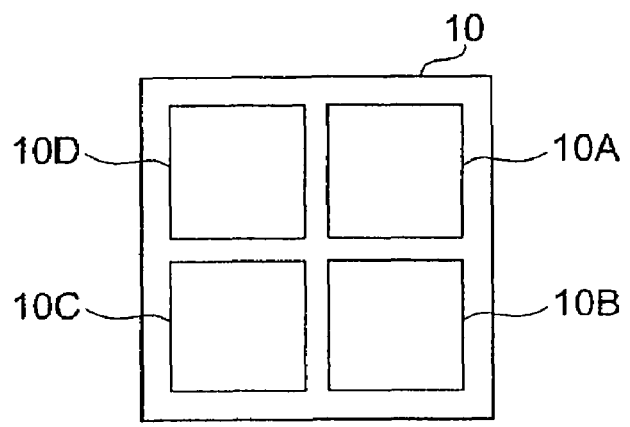
FIG. 1 is a plane view of the configuration of complementary four-divided stencil masks.
Figure 2:
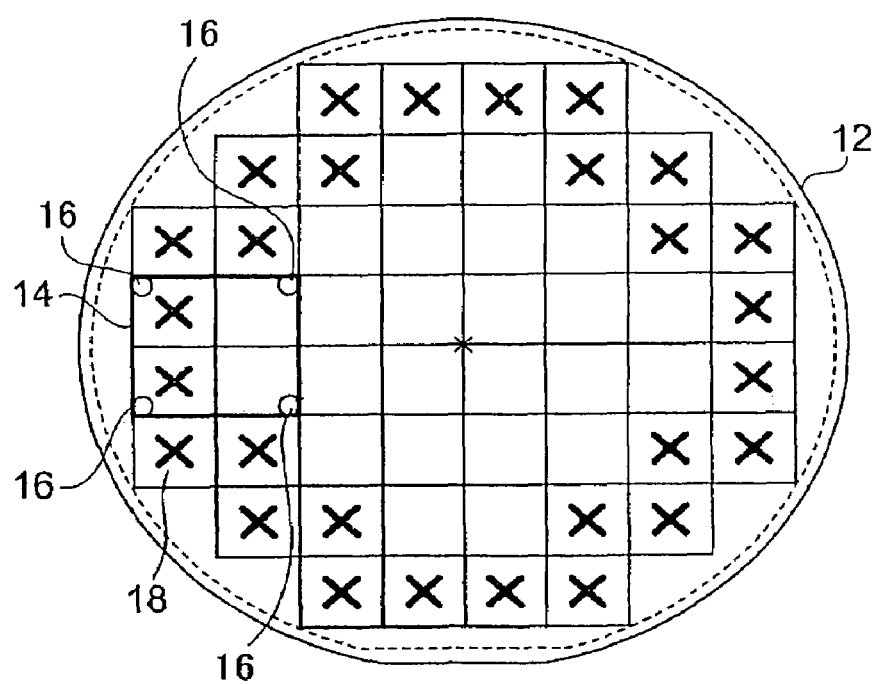
FIG. 2 is a plane view of chip regions of a semiconductor wafer to be exposed.

The present embodiment is a method of exposure on a semiconductor wafer 12 shown in FIG. 2 using the above-mentioned equal magnification transfer type complementary four-divided masks 10 shown in FIG. 1.

First, the position of a wafer stage of an exposure apparatus and the position of the mask are adjusted to align a semiconductor wafer carried on the wafer stage.

Figure 3A:
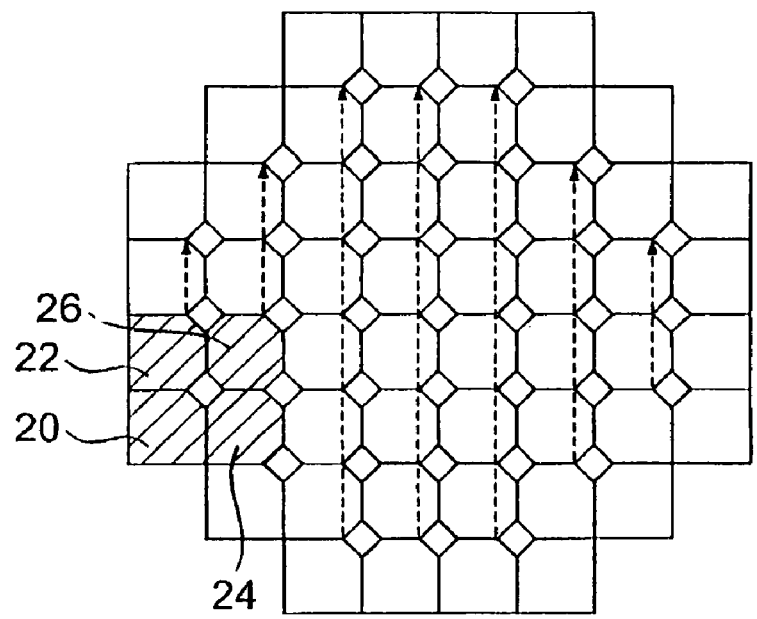
FIG. 3A to FIG. 3E are plane views of semiconductor wafers for explaining the procedure for alignment of complementary four-divided stencil masks and exposure of region according to a first embodiment.

Next, a plurality of alignment marks in an exposure regions including the first chip region 20 of the bottom left part of a shadow region of FIG. 3A are detected to obtain the coordinates of the alignment marks, then obtain the errors between the detected coordinates of alignment marks and the coordinates based on design data of the alignment mark. Following, the next alignment coefficient equations are established based on the detection results. Note that a "chip region" means a region corresponding to one semiconductor chip. In the present embodiment, an exposure objective unit region is illustrated as one semiconductor chip.

$$\Delta x_1 = a_1 x_1 + b_1 x_1 + c_1 \quad (1)$$

$$\Delta y_1 = d_1 x_1 + e_1 y_1 + f_1 \quad (2)$$

In the equations (1) and (2), $x_1$ and $y_1$ are X-coordinates and Y-coordinates (center coordinates) based on the design data of the chip center from the first chip region 20, $\Delta x_1$ and $\Delta y_1$ are the errors of the design data of the center coordinates $x_1$, $y_1$ of the first chip region 20 due to alignment error of the semiconductor wafer, and $a_1$ to $f_1$ are alignment coefficients.

In order to obtain the alignment coefficients $a_1$ to $f_1$, the coordinates of the alignment marks for a number of marks necessary for solving six simultaneous equations are measured. In the present embodiment, the design coordinates $(X_{M1}, Y_{M1})$, $(X_{M2}, Y_{M2})$, and $(X_{M3}, Y_{M3})$ of three alignment marks and the coordinates errors $(\Delta x_{M1}, \Delta y_{M1})$, $(\Delta x_{M2}, \Delta y_{M2})$, and $(\Delta x_{M3}, \Delta y_{M3})$ due to alignment errors of the semiconductor wafer from the design coordinates of the alignment marks are obtained, the following simultaneous equations are established, then the simultaneous equations are solved to obtain $a_1$ to $f_1$.

$$\Delta x_{M1} = a_1 x_{M1} + b_1 x_{M1} + c_1$$

$$\Delta y_{M1} = d_1 x_{M1} + e_1 y_{M1} + f_1$$

$$\Delta x_{M2} = a_1 x_{M2} + b_1 x_{M2} + c_1$$

$$\Delta y_{M2} = d_1 x_{M2} + e_1 y_{M2} + f_1$$

$$\Delta x_{M3} = a_1 x_{M3} + b_1 x_{M3} + c_1$$

$$\Delta y_{M3} = d_1 x_{M3} + e_1 y_{M3} + f_1$$

Assuming that the chip coordinates of the first chip region 20 (the center coordinates of the chip region) are $(x_1 + \Delta x_1, y_1 + \Delta y_1)$, the complementary divided stencil masks are moved to align them and the regions are exposed at the exposure position shown by the diamond marks in the middle of the shadow region in FIG. 3A. In other words, the complementary four-divided stencil masks 10 are aligned by so-called die-by-die alignment method, then the first chip region 20 is exposed through the third mask region 10C of the complementary four-divided stencil mask 10.

Here, in the present embodiment, "die-by-die alignment method" means a method for measuring the positions of the alignment marks formed in previous step on a semiconductor wafer for the respective shots, aligning the masks, and determining an exposure positions by this.

In FIG. 3A, the broken line arrow shows the direction of movement of the exposure shot at that time of alignment and exposure by die-by-die alignment method.

Due to this exposure, the pattern of the third mask region 10C of the complementary four-divided stencil mask 10 is transferred to the first chip region 20, while the pattern of the fourth mask region 10D of the complementary four-divided stencil mask 10 is transferred to the second chip region 22 located one chip above the first chip region 20.

The pattern of the second mask region 10B of the complementary four-divided mask 10 is transferred to the chip region 24 located one chip to the right of the first chip region 20, while the pattern of the first mask region 10A of the complementary four-divided mask 10 is transferred to the chip region 26 located one chip to the right of the second chip region 22.

Figure 3B:
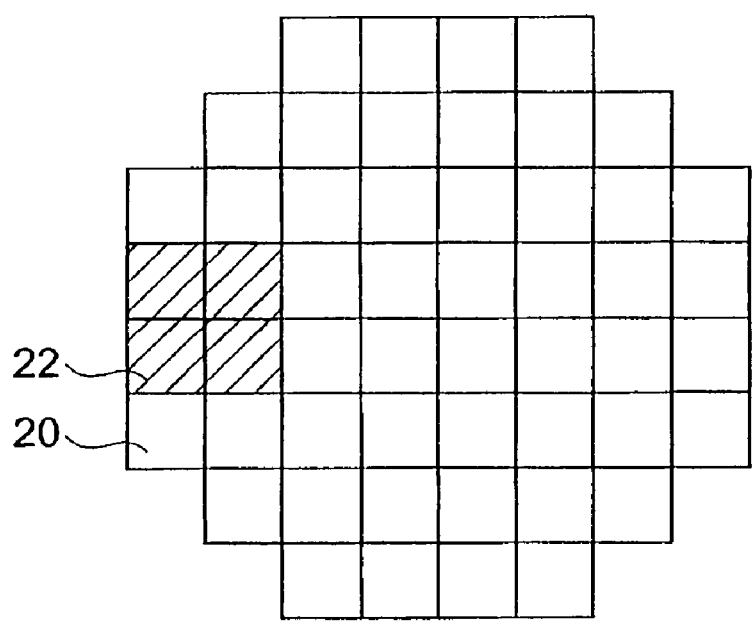

Next, as shown in FIG. 3B, the second chip region (bottom left part of the shadow region in FIG. 3B) 22 located one chip above the first chip region 20 is exposed in the same way as with the exposure procedure of the first chip region 20 to transfer the pattern of the third mask region 10C of the complementary four-divided stencil mask 10.

The chip regions around the second chip region 22 are also, as described above, exposed to transfer the patterns of the first mask region 10A, the second mask region 10B, the third mask region 10C, and the fourth mask region 10D of the complementary four-divided stencil mask 10.

Figure 3C:
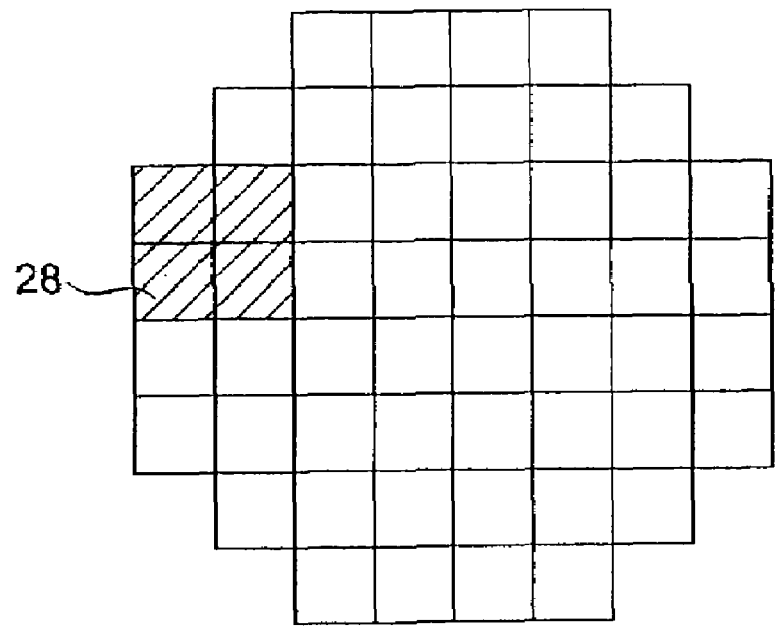

Following, as shown in FIG. 3C, the third chip region (bottom left part of the shadow region in FIG. 3C) 28 located one chip above the second chip region is exposed in the same way as the exposure procedure of the first chip region.

Blow, in the same way, the masks are aligned by die-by-die alignment method and the respective exposure positions are exposed for all of the chip regions of the middle portion of the semiconductor wafer which can be aligned by die-by-die alignment method and exposed, that is, for the fourth . . . n-th chip regions. That is, an exposure operation comprised of die-by-die alignment method and exposure of one shot is successively performed.

Here, "all of the chip regions at the middle portion of the semiconductor wafer in range where exposure is possible by die-by-die alignment method (the first region)" means chip regions provided with alignment marks at the four corners of the exposure regions.

And, the alignment coefficients found for alignment by die-by-die alignment method for chip regions at the middle portion of the semiconductor wafer in the above exposure procedure are used to obtain alignment coefficient equations (3) and (4) of so-called global alignment method at the middle portion of the semiconductor wafer or near it in the same way as in above equations (1) and (2).

$$\Delta X = aX + bY + c \quad (3)$$

$$\Delta Y = dX + eY + f \quad (4)$$

In the equations (3) and (4), X and Y are X-coordinates and Y-coordinates on the design data of the alignment marks at the middle portion of the semiconductor wafer or near it and are reference coordinates of the semiconductor wafer for alignment by global alignment method. $\Delta X$ and $\Delta Y$ are the errors from the reference coordinates X, Y of the semiconductor wafer in the design data due to alignment error of the semiconductor wafer, while a to f are the alignment coefficients.

Here, in the present description, "global alignment method" means the method of previously measuring the positions of the alignment marks of a plurality of points on a semiconductor wafer to determine the coordinates of shots in the semiconductor wafer and moving and exposing the semiconductor wafer according to the coordinates.

Note that, when obtaining the alignment coefficients of global alignment method, there is no need for them to be at the middle portion of the semiconductor wafer or near it. It is also possible to use alignment coefficients of any chip regions aligned by die-by-die alignment method.

And, the alignment coefficients obtained for alignment by die-by-die alignment method for chip regions at the middle portion of the semiconductor wafer in the above exposure procedure are used to establish alignment coefficient equations (5) and (6) for chip center coordinates of the chip regions desired to be exposed at the outer circumference portion of the semiconductor wafer, that is, the chip coordinates (x, y).

$$\Delta x = a'x + b'y + c' \quad (5)$$

$$\Delta y = d'x + e'y + f' \quad (6)$$

In the equations (5) and (6), x and y are X-coordinates and Y-coordinates of design data of the chip center of chip regions near the alignment marks when establishing the alignment equations (3) and (4), $\Delta X$ and $\Delta Y$ are the errors from the chip center coordinates x, y on the design data due to alignment error of the semiconductor wafer, a' to f' are the alignment coefficients.

Further, the coefficient a' to f' use alignment coefficients obtained for alignment by die-by-die alignment method in chip regions at the middle portion of the semiconductor wafer by the above exposure procedure.

And, the established alignment coefficient equations (3) and (4) are used to established, as given blow, the alignment correction values ($\Delta X_0$, $\Delta Y_0$) of the semiconductor wafer reference coordinates ($X_0$, $Y_0$) of the semiconductor wafer.

$$\Delta X_0 = aX_0 + bX_0 + c \quad (3')$$

$$\Delta Y_0 = dY_0 + eY_0 + f \quad (4')$$

Figure 3D:
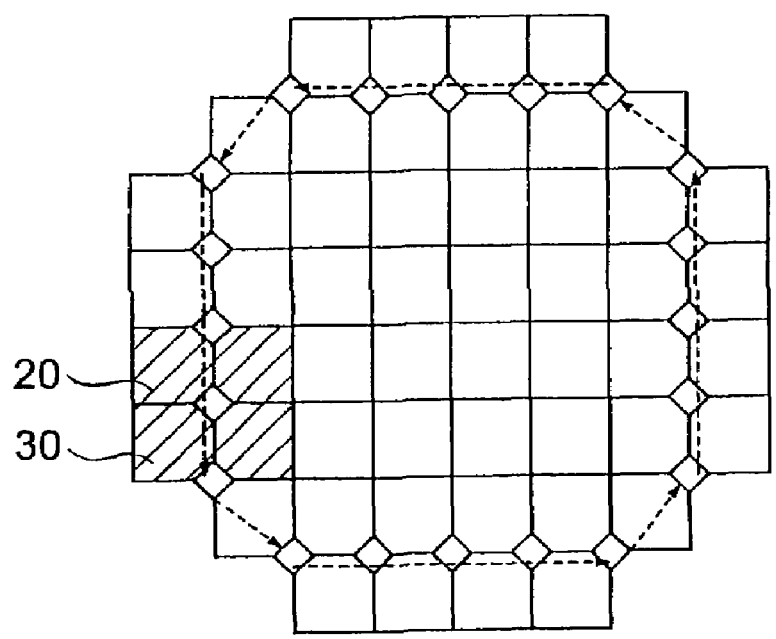

And, the established alignment coefficient equations (5) and (6) are used to find the alignment correction value ($\Delta x_0$, $\Delta y_0$) of the chip coordinates ($x_0$, $y_0$) of the chip regions desired to be exposed at the outer circumference portion of a semiconductor wafer, for example, the chip coordinates ($x_0$, $y_0$) of the chip region 30 shown in FIG. 3D.

$$\Delta x_0 = a'x_0 + b'x_0 + c \quad (5')$$

$$\Delta y_0 = d'y_0 + e'Y_0 + f \quad (6')$$

And, the complementary four-divided mask 10 is aligned by global alignment method based on the semiconductor wafer reference coordinates ($X_0 + \Delta X_0$, $Y_0 + \Delta Y_0$) and the chip coordinates ($x_0 + \Delta x_0$, $y_0 + \Delta y_0$) of the chip region 10 and the chip region 30 is exposed. By using two coordinates in this way, the planar position of the semiconductor wafer is fixed to one position.

And, at the outer circumference portion of the semiconductor wafer, the complementary four-divided mask is aligned by global alignment method, then, after global alignment method, the region is exposed. In FIG. 3D, the broken line arrow shows the direction of movement of the exposure shot when aligning masks and exposing a region by global alignment method.

Figure 3E:
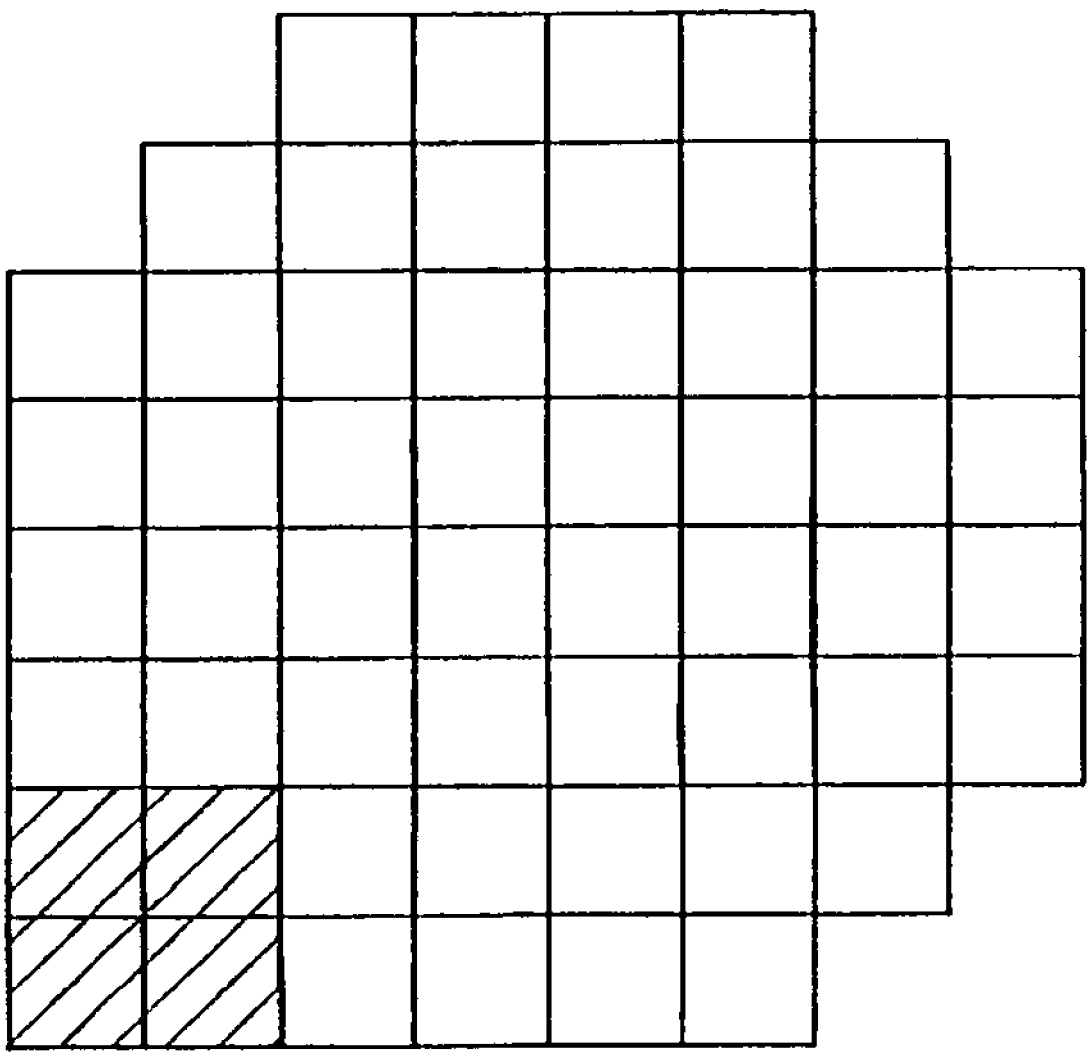

And, as shown in FIG. 3E, the same procedure is followed to align the masks and expose the next chip region of the outer circumference portion of the semiconductor wafer by global alignment method.

Exposure is repeated by the above procedure until all of the chip regions at the outer circumference portion of the semiconductor wafer finish being exposed.

Figure 4:
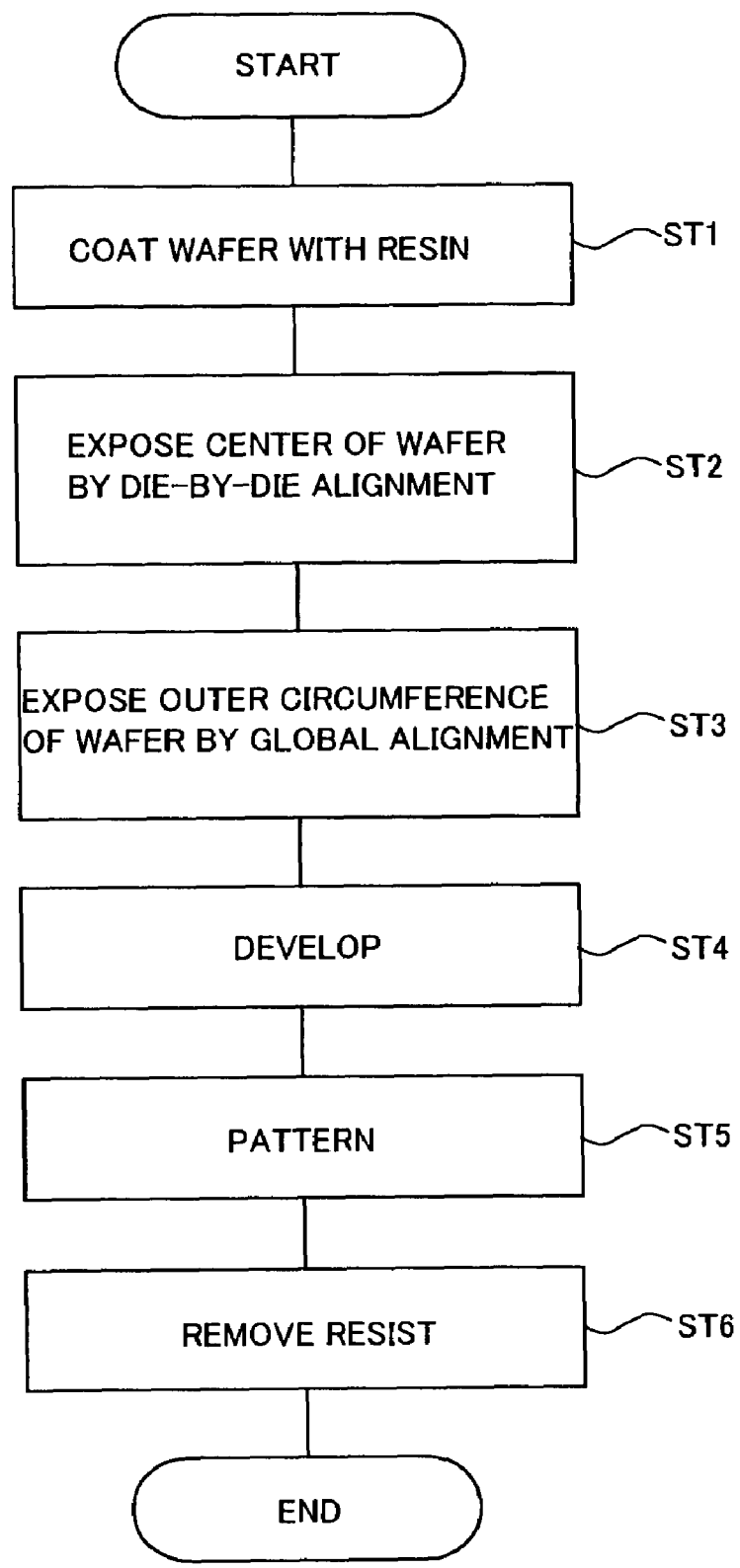
FIG. 4 is a flow chart of an exposure step in production of a semiconductor device according to the present embodiment.

In a step of transferring a pattern to a semiconductor device according to the exposure method of the present embodiment, as shown FIG. 4, first, a resist is coated on the semiconductor wafer (step ST1). And, as explained above, at regions at the middle portion of the semiconductor wafer (first region), the complementary divided mask is aligned by die-by-die alignment method and the regions are exposed (step ST2). Following, as described above, at regions outer circumference portion of the middle portion of the semiconductor wafer (second region), the complementary divided mask is aligned by global alignment method and the regions are exposed (step ST3). Next, the resist film is developed (step ST4) and the resist film is used as an etching mask to pattern the semiconductor wafer (step ST5), then finally the resist film is removed (step ST6), whereby the desired pattern is transferred to the semiconductor device.

In the present embodiment, at the chip regions at the middle portion of a semiconductor wafer, the complementary divided mask is aligned and the regions exposed by die-by-die alignment method so as to improve the positioning precision of the exposure. And, at the outer circumference portion of the semiconductor wafer where die-by-die alignment method cannot be used, global alignment method is applied to avoid the problem of being unable to use die-by-die alignment method for all chip regions of the semiconductor wafer.

Further, when aligning masks with respect to outer circumference chip regions by global alignment method, by using alignment coefficient obtained when alignment marks with respect to chip regions at the middle portion of the semiconductor wafer by die-by-die alignment method, it is possible to reduce the time and cost involved in calculating the alignment coefficient required when applying global alignment method.

Note that, with global alignment method, when time elapses from mark detection, due to the difference in the initial temperature of the semiconductor wafer at that time of mark detection and the temperature of the semiconductor wafer dependent on the temperature of the stage at the time of exposure, the thermal expansion or the thermal contraction of the semiconductor wafer occurs at the time of exposure, and becomes a cause of positional deviation of the complementary divided stencil masks.

On the other hand, a semiconductor wafer is generally of a type affixed by holding the semiconductor wafer at the center of the semiconductor wafer isotropically in the radius direction of the semiconductor wafer, so changes in shape of the semiconductor wafer due to thermal expansion start from the center of the semiconductor wafer and the amount of change becomes larger the further to the outer circumference portion of the semiconductor.

Figure 5A:
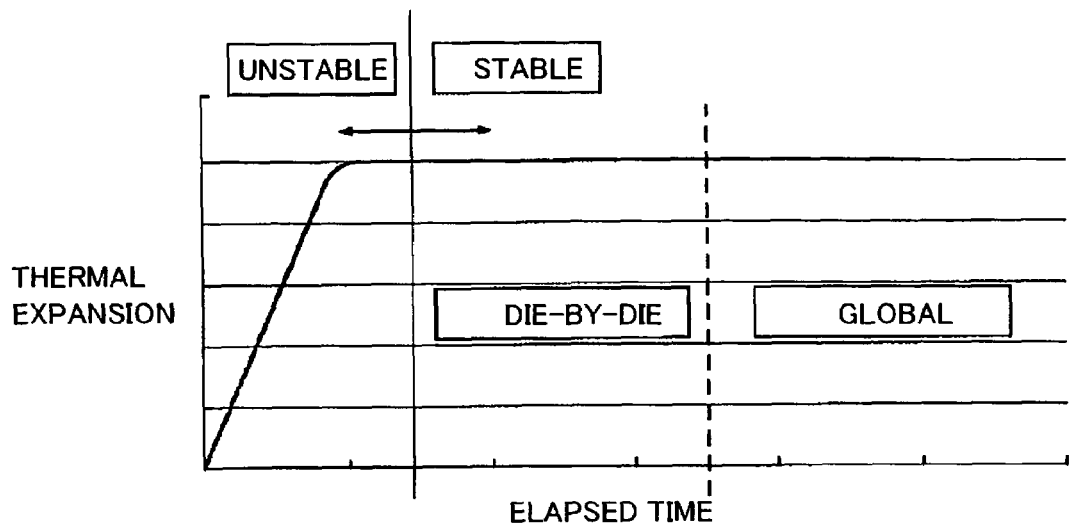

Thermal expansion is a relaxation phenomenon and, as shown in FIG. 5A, becomes stable along with the elapsing of a certain time. Therefore, by first aligning and exposing the middle portion of the semiconductor wafer by die-by-die alignment method and, after the thermal expansion stabilizes, aligning the chip regions of the outer circumference portion of the semiconductor wafer where the effect of fluctuations in alignment caused by thermal expansion is large by global alignment method as in the present embodiment, it is possible to stably align all exposure shot regions.

Figure 5B:
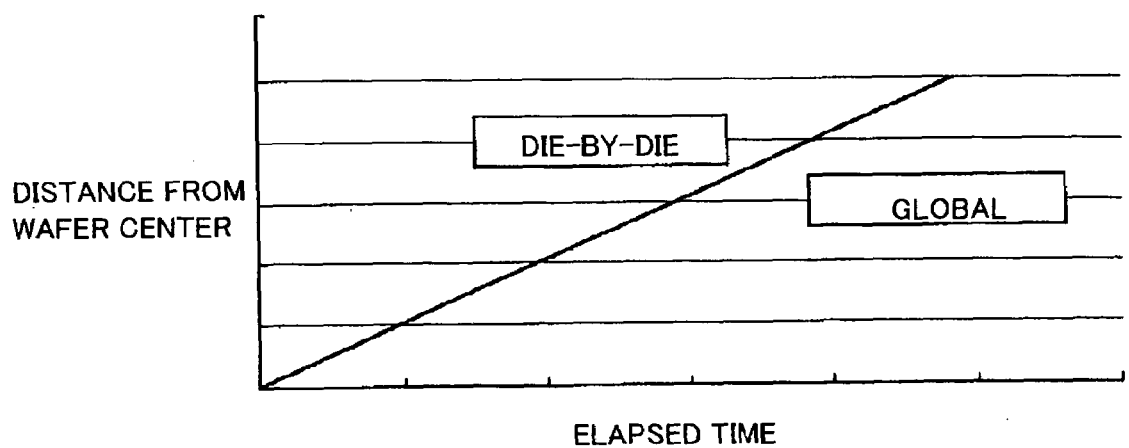
FIG. 5B is a view of selective use of die-by-die alignment method and global alignment method depending on the distance from the center of a semiconductor wafer and the elapse time.

For example, as shown in FIG. 5A and FIG. 5B, it is possible to selectively use die-by-die alignment method and global alignment method depending on the thermal expansion of a semiconductor wafer and elapsed time or on the distance from the center of a semiconductor wafer and elapsed time.

By using the exposure method as described above, the positioning precision of the transfer pattern formed in a semiconductor device is improved, so it is possible to contribute to improvement of the reliability and improvement of the yield of the semiconductor device. Besides, the time and cost involved in calculating the alignment coefficient required when using global alignment method can be reduced, so it is possible to contribute to a reduction of the cost of production of a semiconductor device.

Second Embodiment

The present embodiment is another example of an embodiment of application of the exposure method using complementary divided masks according to the present invention to an exposure method using equal magnification transfer type complementary four-divided masks for LEEPL of electron beam transfer lithography. FIG. 6A to FIG. 6E are plane views of semiconductor wafers explaining the procedures of alignment of complementary four-divided stencil masks and exposure of the present embodiment.

The present embodiment is a method using the above equal magnification transfer type complementary four-divided masks 10 to expose the semiconductor wafer 12. The following steps are used for exposure.

First, in the same way as in the first embodiment, the position of the wafer stage of the exposure apparatus and the position of the mask are adjusted to align the semiconductor wafer carried on the wafer stage.

Figure 6A:
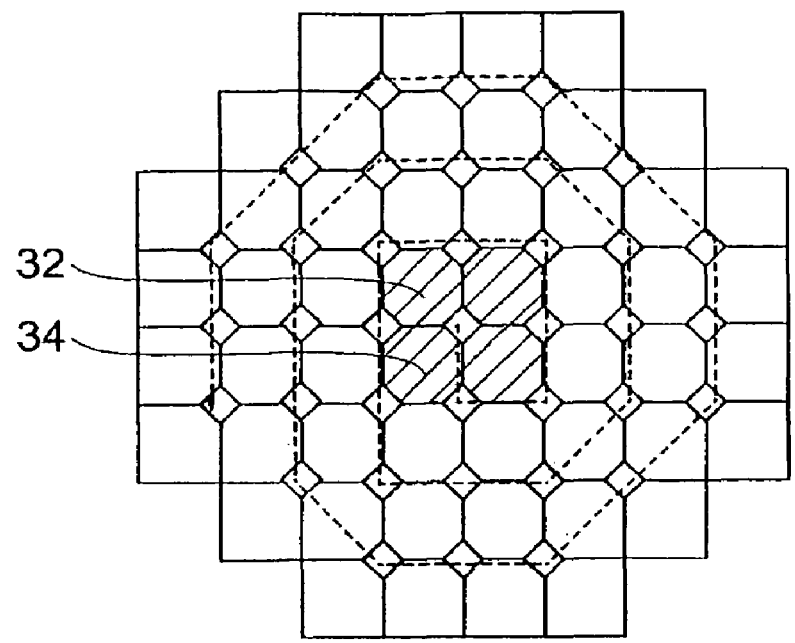
FIG. 6A to FIG. 6E are plane views of a semiconductor wafer for explaining the procedure of alignment of a complementary four-divided stencil mask and exposure of regions according to a second embodiment.

Next, as shown in FIG. 6A, in the same way as the first embodiment, the masks are aligned and the regions are exposed by die-by-die alignment method for the first chip region (the top left part of shadow region of FIG. 6A) 32 at the middle portion of the semiconductor wafer.

Figure 6B:
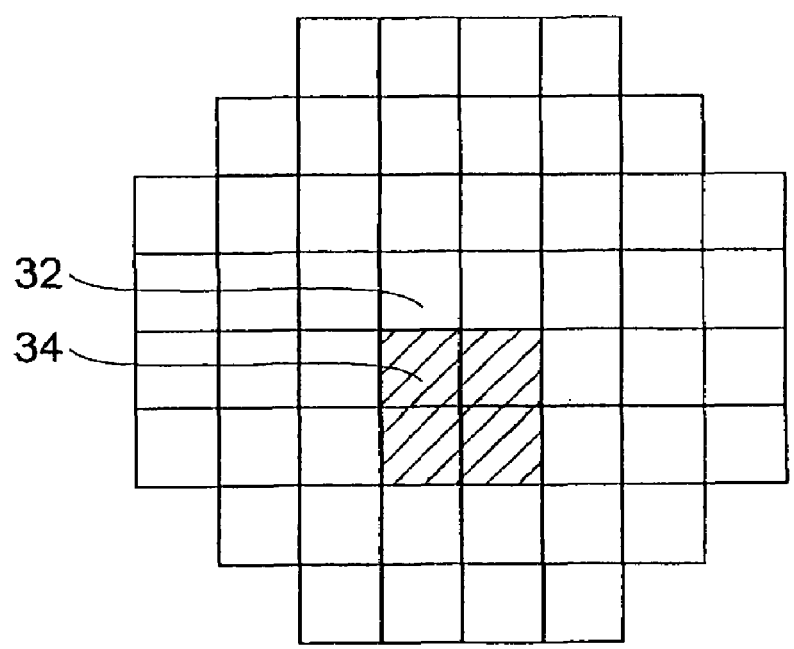

Next, as shown in FIG. 6B, in the same way as the first embodiment, the masks are aligned and the regions are exposed by die-by-die alignment method for the second chip region (the top left part of shadow region of FIG. 6B) 34 at the middle portion of the semiconductor wafer.

Figure 6C:
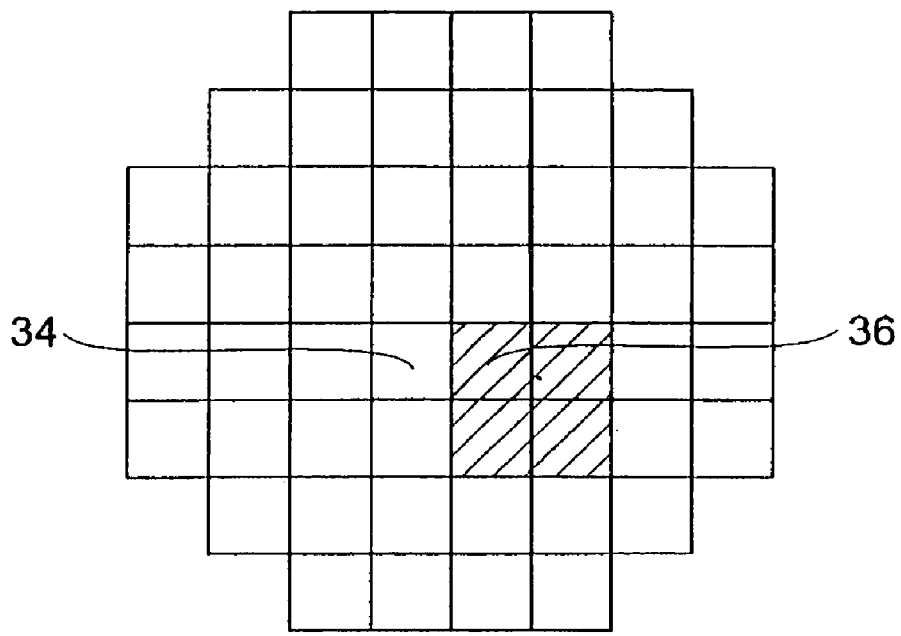

Next, as shown in FIG. 6C, in the same way as the first embodiment, the masks are aligned and the regions are exposed by die-by-die alignment method for the third chip region (the top left part of shadow region of FIG. 6C) 36 at the middle portion of the semiconductor wafer.

After this, the masks are aligned and the regions are exposed by die-by-die alignment method while moving the exposure shot in a spiral manner.

In FIG. 6A, the broken line arrow shows the direction of movement of the exposure shot when aligning the masks and exposing regions by die-by-die alignment method.

Figure 6D:
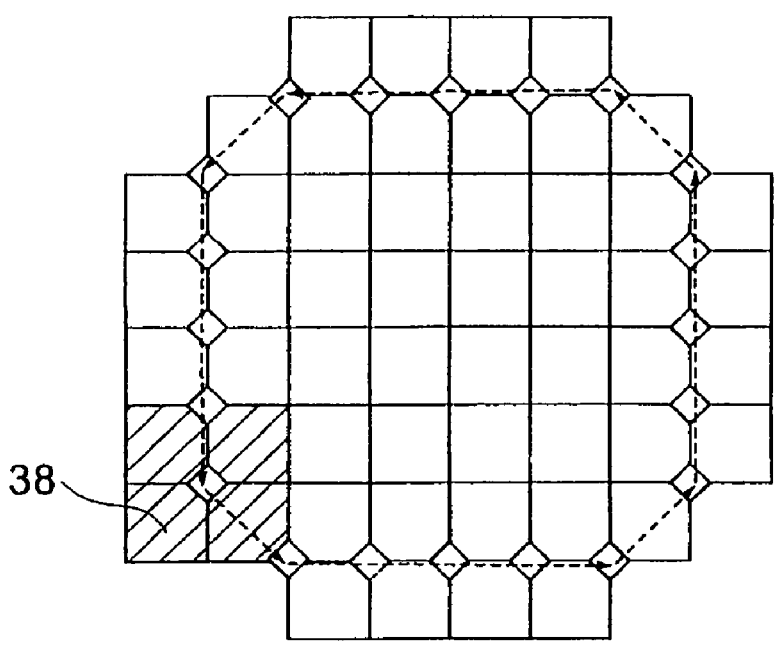
Figure 6E:
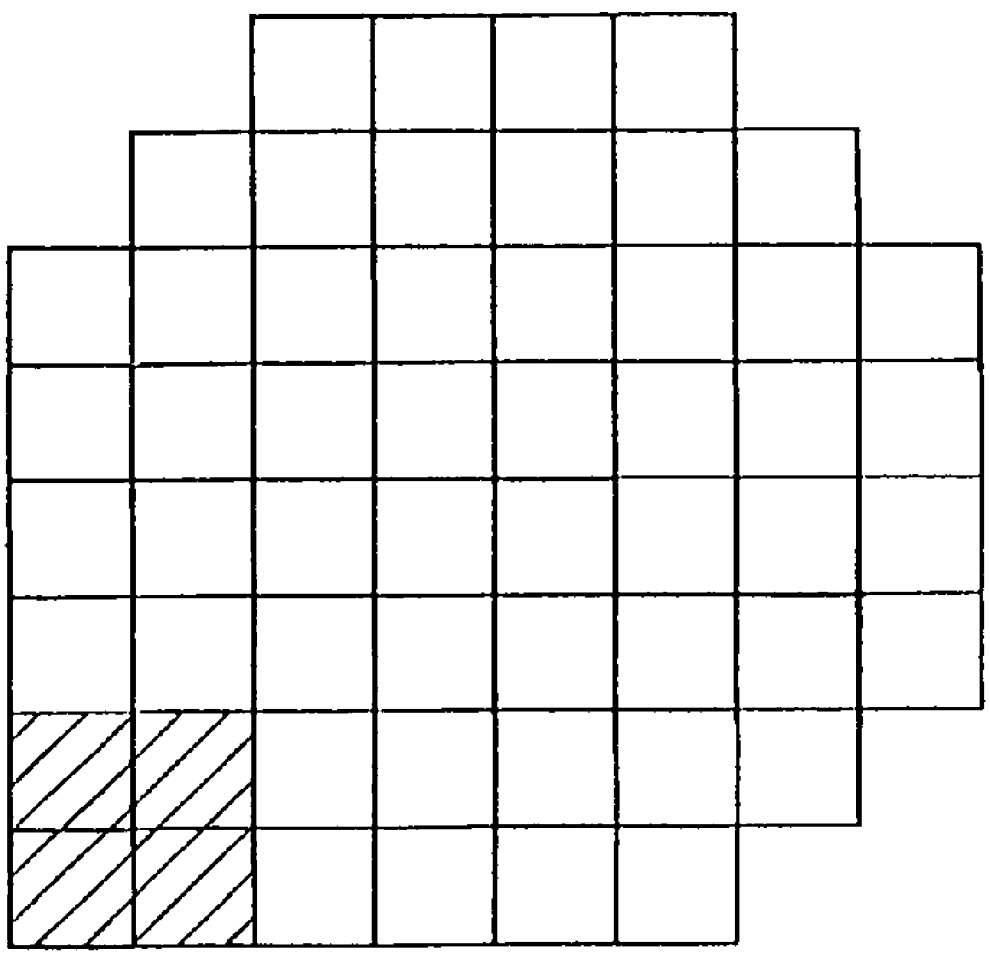

And, as shown in FIG. 6D, in the same way as the first embodiment, the masks are aligned and the regions are exposed by global alignment method for the chip region (bottom left part of shadow region of FIG. 6D) 38 of the outer circumference portion of the semiconductor wafer.

In FIG. 6D, the broken line arrow shows the direction of movement of the exposure shot when aligning the masks and exposing regions by global alignment method.

After this, the masks are aligned and the regions are exposed by global alignment method for the chip regions (shadow region of FIG. 6E) at the outer circumference of the semiconductor wafer along the outer circumference of the semiconductor.

In the present embodiment, first the masks are aligned and the regions are exposed from the chip region of the middle portion of the semiconductor wafer (first chip region) where there is little effect of fluctuations due to thermal expansion, then the exposure shot is moved in a spiral manner and the masks are aligned and the regions are exposed by global alignment method for the outer circumference chip region (second region) at the outside of the center of a semiconductor wafer.

Due to this, it is possible to reduce the effect of thermal expansion on detection data of alignment marks required for global alignment method of the outer circumference chip region and improve the overlay precision.

Third Embodiment

Figure 7A:
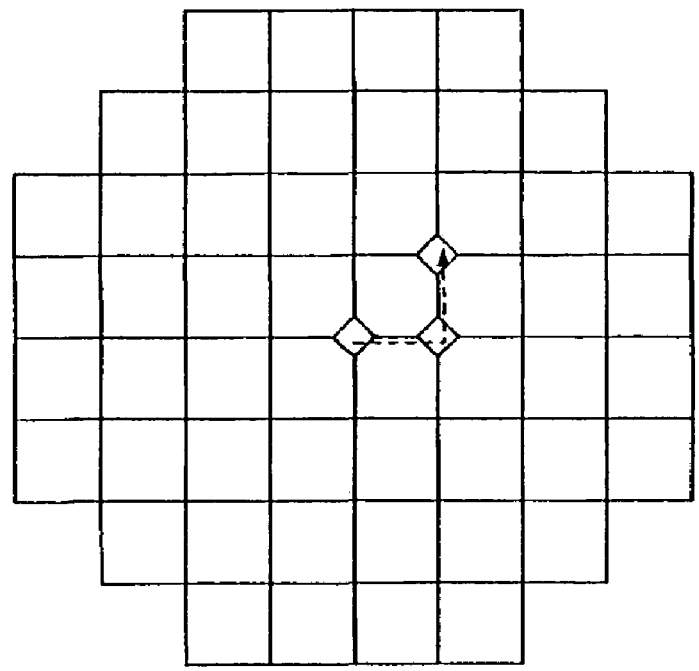
FIG. 7A to FIG. 7C are plane views of a semiconductor wafer for explaining the procedures of alignment of a complementary four-divided stencil mask and exposure of regions according to a third embodiment.
Figure 7B:
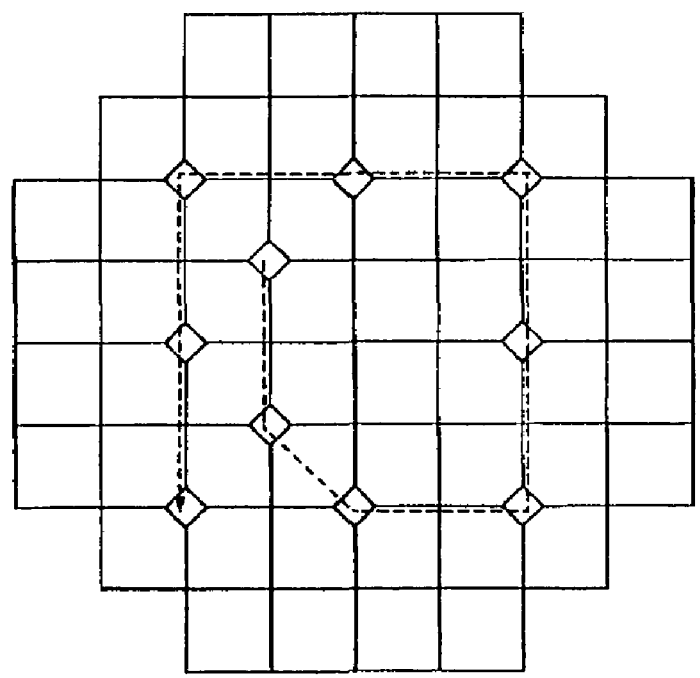
Figure 7C:
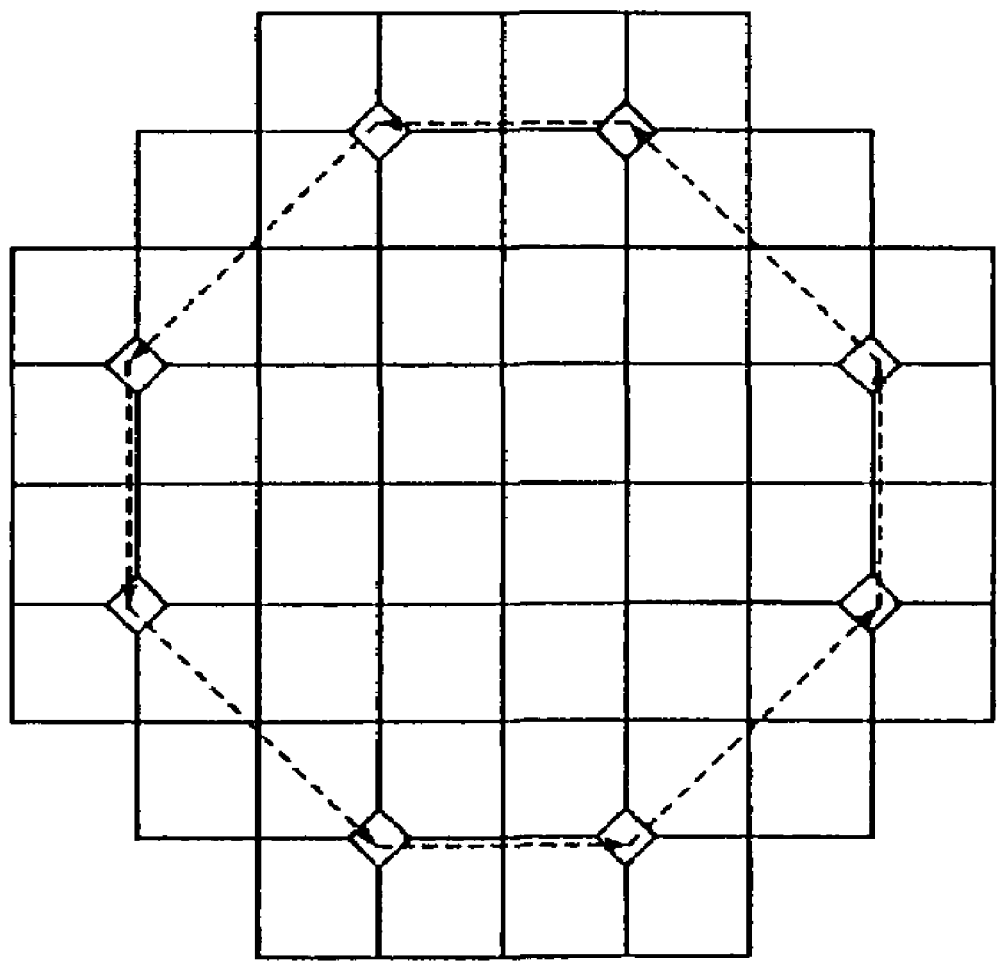

The present embodiment is another example of application of the exposure method using complementary divided masks according to the present invention to an exposure method using equal magnification transfer type complementary four-divided masks for LEEPL of electron beam transfer lithography. FIG. 7A to FIG. 7C are plane views of semiconductor wafers for explaining the procedures of alignment of complementary four-divided stencil masks and exposure of regions of the present embodiment.

The present embodiment is a method using the above equal magnification transfer type complementary four-divided masks 10 to expose the semiconductor wafer 12. The following steps are used for exposure.

First, in the same way as in the first embodiment, the position of the wafer stage of the exposure apparatus and the position of the mask are adjusted to align the semiconductor wafer carried on the wafer stage.

Note that, the parameters required for global alignment method include, assuming the alignment equation is linear, six types of parameters of the offset X, offset Y, wafer magnification X, wafer magnification Y, wafer rotation X, and wafer rotation Y. To obtain these parameters, the marks of minimum three chips have to be detected.

Therefore, first, as shown in FIG. 7A, in the same way as the first embodiment, the masks are aligned and the regions are exposed by die-by-die alignment method for the first to third chip regions of the centermost portion. In FIG. 7A, the broken line arrow shows the direction of movement of an exposure shot when aligning the masks and exposing regions by die-by-die alignment method.

Next, as shown in FIG. 7B, the masks are aligned and the regions are exposed by global alignment method for the chip regions outside the first to third chip regions. At that time, the masks are aligned and the regions are exposed by die-by-die alignment method skipping a few points at a time, for example, in the present embodiment, two points at a time. The global alignment coefficients are modified as required based on the mark detection value at that time.

Similarly, as shown in FIG. 7C, the masks are aligned and the regions are exposed by global alignment method for further outside chip regions. At that time, the masks are aligned and the regions are exposed by die-by-die alignment method skipping a few points at a time, for example, four points at a time.

Finally, in the same way as the first embodiment, the masks are aligned and the regions are exposed by global alignment method for the chip region at the outermost circumference (second region) of the semiconductor wafer.

In the present embodiment, when exposing a plurality of exposure shots at the centermost part of the semiconductor wafer, the masks are aligned by die-by-die alignment method. Further, at chip regions outside of the centermost portion of the semiconductor wafer, the masks are aligned by global alignment method. At that time, the masks are aligned by global alignment method using alignment coefficients when applying by die-by-die alignment method to the centermost portion of the semiconductor wafer.

In global alignment in chip regions outside of the center portion of the semiconductor wafer, the masks are aligned by die-by-die alignment method every desired exposure shot to suppress the occurrence of alignment error due to global alignment method.

Besides, in the later steps of the interconnection forming process, there is a large possibility of deformation of the semiconductor wafer due to changes in conditions, so the masks are aligned by die-by-die alignment every two exposure shots or three exposure shots to suppress the occurrence of alignment errors.

In this way, when moving the exposure shot in a spiral manner in exposure of the outer circumference chip regions, the complementary divided masks are aligned and alignment error is corrected by die-by-die alignment method every predetermined number of exposure shots.

In the present embodiment, by rationally reducing the number of alignments by die-by-die alignment method, alignment is possible with a high throughput and high precision.

Fourth Embodiment

Figure 8:
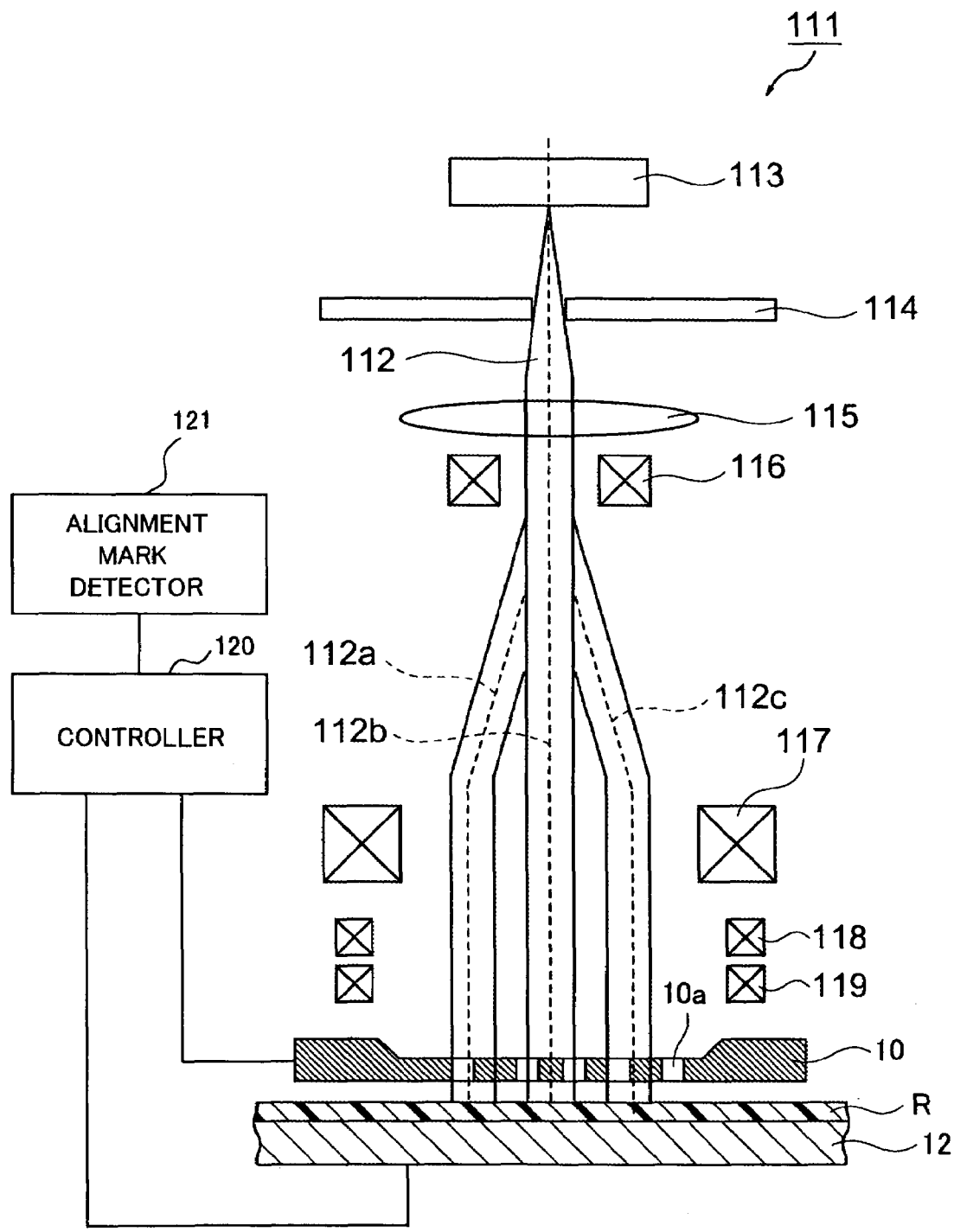
FIG. 8 is a general view of the configuration of an example of an exposure apparatus according to an embodiment.

FIG. 8 is a view of the general configuration of an exposure apparatus able to use the exposure methods according to the first to third embodiment. The exposure apparatus shown in FIG. 8 is an exposure apparatus used for LEEPL.

The exposure apparatus 111 shown in FIG. 8 has, as an exposure optical system, an electron gun 113 for producing an electron beam 112 and also an aperture 114, condenser lens 115, pair of main deflectors 116 and 117, and pair of fine adjustment deflectors 118 and 119. And, it has a control part 120 for controlling the operation of the apparatus as a whole and an alignment mark detection part 120 for detecting alignment marks provided at the semiconductor wafer 12 and the complementary divided masks 10.

The aperture 114 limits the electron beam 112. The condenser lens 115 converts the electron beam 112 into parallel beam. The sectional shape of the electron beam 112 condensed by the condenser lens 115 is in normally a circle, but may be another sectional shape as well. The main deflectors 116 and 117 and the fine adjustment deflectors 118 and 119 are deflector coils. The main deflectors 116 and 117 deflect the electron beam 112 so that the electron beam 112 strikes the surface of the complementary divided stencil mask 10 basically perpendicularly.

The fine adjustment deflectors 118 and 119 deflect the electron beam 112 so that the electron beam 112 strikes the surface of the complementary divided stencil mask 10 perpendicularly or inclined slightly from the perpendicularly direction. The angle of incidence of the electron beam 112 is optimized according to the pattern position on the complementary divided mask 10 etc., but the angle of incidence of the electron beam 112 is about 10 mrad even at the maximum. The electron beam 112 strikes the complementary divided stencil mask 10 substantially perpendicularly.

The control part 120 controls operation of not shown hold means for holding the complementary divided stencil masks 10 and the semiconductor wafer 12 and controls the relative positions of the complementary divided stencil masks 10 and the semiconductor wafer 12.

The control part 120 aligns the mask by die-by-die alignment method as described in the fist embodiment based on the positions of alignment marks detected by the alignment mark detecting part 121.

Besides, at the outermost circumference regions where alignment of the complementary divided masks by detection of alignment marks cannot be used, the alignment coefficients obtained by die-by-die alignment method are used to determine the coordinates of the chip at the outermost circumference regions and align the masks as explained above.

The electron beam 112a to 112c shown in FIG. 8 show that the electron beam 112 scanning the complementary divided masks 10 strikes positions on the complementary divided stencil masks 10 substantially perpendicularly and do not show that the electron beam 112a to 112c strikes positions on the complementary divided stencil masks 10 at the same time. The scan by the electron beam 112 may be either of a raster scan and of a vector scan.

In FIG. 8, resist film R on a semiconductor wafer 12 is exposed by the electron beam passing through the hole parts 10a of the complementary divided stencil masks 10. For LEEPL, equal magnification masks are used. The complementary divided masks 10 and the semiconductor wafer 12 are arranged in closed proximity.

At that time of the electron beam exposure by the above exposure apparatus 111, as the complementary divided stencil mask 10, for example, the four-divided complementary divided masks 10 shown in FIG. 1 are used.

Fifth Embodiment

Figure 9:
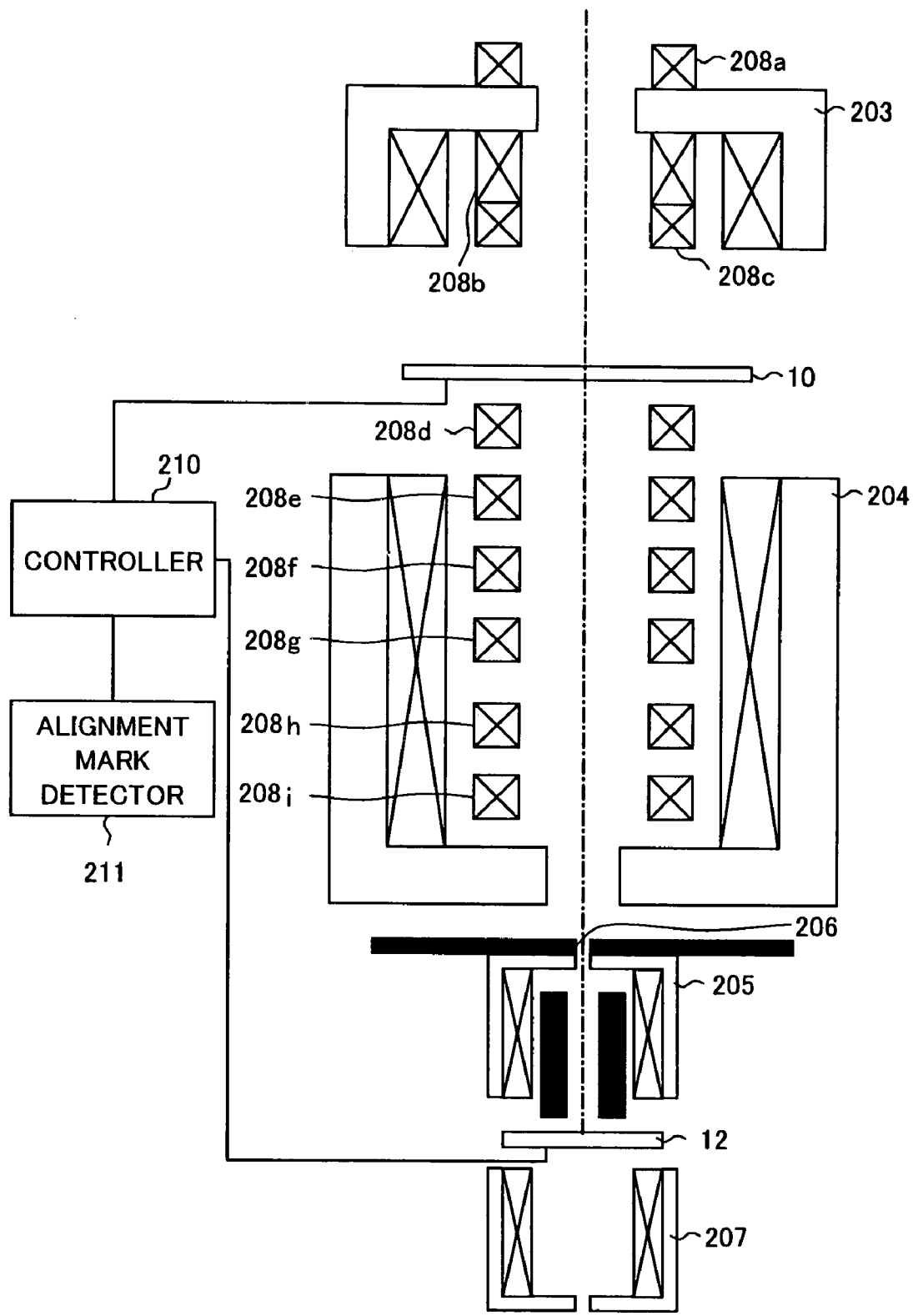
FIG. 9 is a general view of the configuration of an example of an exposure apparatus according to an embodiment.

FIG. 9 is a view of configuration of an exposure apparatus able to use the exposure methods according to the above first to third embodiment.

In the electron beam exposure apparatus shown in FIG. 9, the patterns of the complementary divided masks (reticle) 10 are transferred reduced by a predetermined magnification to the wafer 12 using electron beams.

The electron beam exposure apparatus has, as an exposure optical system, a condenser lens 203, first projection lens 204, second projection lens 205, crossover aperture 206, under sample lens 207, and the plurality of deflectors 208a to 208i. And, it has a control part 210 for controlling movement of the apparatus as a whole and alignment mark detection part 211 for detecting alignment marks provided at the semiconductor wafer 12 and complementary divided masks 10. The condenser lens 203 and the first projection lens 204 directly in front of the complementary divided masks 10 caused distribution of the magnetic field in a direction from the complementary divided masks 10 to the semiconductor wafer 12 shown by the broken lines in FIG. 9.

The control part 210 controls operation of not shown hold means for holding the complementary divided stencil masks 10 and the semiconductor wafer 12 and controls the relative positions of the complementary divided stencil masks 10 and the semiconductor wafer 12.

The control part 120 aligns the masks by die-by-die alignment method as described the fist embodiment based on the positions of alignment marks detected by the alignment detecting part 211.

Further, at the outermost circumference regions where alignment of the complementary divided masks by detection of alignment marks cannot be used, the alignment coefficients obtained by die-by-die alignment method are used to determine the coordinates of the chips at the outermost circumference region and align the masks as explained above.

In the projection optical system shown in FIG. 9, a deflected magnetic field is generated by the plurality of deflectors 208a to 208i so that the electron beam passed through the mask 10 passes through the crossover aperture 206 and perpendicularly strikes the semiconductor wafer 12.

The exposure method, the exposure apparatus, semiconductor device, and the method of producing the same of the present invention are not limited to the above explanation of the above embodiment.

For example, the present invention can be applied for all lithographic technology requiring complementary divided technology. The number of divided into is not also limited. Further, the present invention can also be applied to exposure using membrane masks with patterns formed by chromic film and others in addition to stencils.

Besides, in addition to an LEEPL or other exposure method using an equal magnification proximity type exposure apparatus, the present invention can also be applied to PREVAIL or other exposure method using an electron beam transfer apparatus or variable shape type electron beam direct drawing apparatus and further alignment of complementary divided stencil masks and exposure at the time of using X-ray lithography, photo lithography, and ion beam lithography.

INDUSTRIAL APPLICABILITY

The exposure method, the exposure apparatus, and the method of producing a semiconductor device of the present invention can be applied to an exposure method using complementary divided technology when forming a transfer pattern in a semiconductor device. And, the semiconductor device of the present invention can be applied to a semiconductor device where the transfer pattern has to be formed by an exposure method using complementary divided technology.

What is claimed is:

1. An exposure method using a complementary divided mask comprising:

a first step for detecting positions of alignment marks provided at the respective exposure objective unit regions, aligning the complementary divided mask based on said detected positions of alignment marks, and exposing the respective exposure objective unit regions in a first region including a plurality of exposure objective unit regions at the middle portion of a semiconductor wafer; and a second step for determining coordinates of exposure objective regions in a second region, outside of said first region, where alignment of said complementary divided mask by detection of alignment marks cannot be used, aligning said complementary divided mask based on said positions of alignment marks detected in said first step, and exposing the regions in said second region, said first step comprises the steps of:

obtaining alignment coefficients based on detection result of positions of said alignment marks, and establishing a first function equation using said alignment coefficients as coefficients for obtaining alignment correction values of said complementary divided mask;

obtaining said alignment correction values according to said first function equation; and aligning said complementary divided mask based on said alignment correction values and exposing regions, said second step comprises the step of:

using said alignment coefficients of said function equation obtained at said first step to establish a second function equation for obtaining alignment correction values of said semiconductor wafer and alignment correction values of the respective exposure objective unit regions of said second region;

using said second function equation to obtain reference coordinates of said semiconductor wafer and coordinates of the respective exposure objective unit regions of said second region; and aligning said complementary divided mask based on said reference coordinates of said semiconductor wafer and said coordinates of the respective exposure objective unit regions of said second region, and exposing regions.

2. An exposure method using a complementary divided mask as set forth in claim 1, wherein a stencil mask is used as said complementary divided mask.

3. An exposure method using a complementary divided mask as set forth in claim 1, wherein, a exposure position is moved in a spiral manner to said first region and said second region in said first step and said second step, and exposed.

4. An exposure method using a complementary divided mask as set forth in claim 3, wherein a stencil mask is used as said complementary divided mask.

5. An exposure method using a complementary divided mask as set forth in claim 1, wherein; said first step comprises: a step of aligning said complementary divided mask by die-by-die alignment method, and exposing regions; and a step of determining coordinates of the respective exposure objective unit regions by global alignment method based on the detection results of said positions of alignment marks detected by exposure by said die-by-die alignment method, aligning said complementary divided mask, and exposing regions.

6. An exposure method using a complementary divided mask as set forth in claim 5, wherein a stencil mask is employed as said complementary divided mask.

7. An exposure method using a complementary divided mask as set forth in claim 5, wherein, an exposure position is moved in a spiral manner to said first region in said first step, and is exposed.

8. An exposure method using a complementary divided mask as set forth in claim 1, wherein: said first step comprises; a step of aligning said complementary divided mask by said die-by-die alignment method, and exposing regions; and a step of determining coordinates of the respective exposure objective unit regions by global alignment method based on the detection results of said positions of alignment marks detected by exposure by said die-by-die alignment method, aligning said complementary divided mask, and exposing regions.

9. An exposure method using a complementary divided mask as set forth in claim 8, wherein a stencil mask is used as said complementary divided mask.

10. An exposure method using a complementary divided mask as set forth in claim 8, wherein, an exposure position is moved in a spiral manner to said first region in said first step, and is exposed.

11. A method of producing a semiconductor device, said method having an exposure process using a complementary divided mask, said exposure process comprising:
 a first step for detecting positions of alignment marks provided at the respective exposure objective unit regions, aligning a complementary divided mask based on said detected positions of alignment marks, and exposing the respective exposure objective unit region in a first region including a plurality of exposure objective unit regions at a middle portion of a semiconductor wafer; and
 a second step for determining coordinates of the respective exposure objective regions in a second region, outside of said first region, where alignment of said complementary divided mask by detection of said alignment marks cannot be used, based on said positions of alignment marks detected at said first step in said second region, aligning said complementary divided mask, and exposing regions, wherein, said first step comprises the steps of: obtaining alignment coefficients based on detection results of positions of said alignment mark, and established a first function equation using said alignment coefficients as coefficients for obtaining alignment correction value of said complementary divided mask; obtaining alignment correction value according to said first function equation; and aligning said complementary divided mask based on said alignment correction value, and exposing regions, said second step comprises the step of: using said alignment coefficients of said function equation obtained at said first step to establish a second function equation for obtaining alignment correction value of said semiconductor wafer and an alignment correction value of the respective exposure objective unit regions of said second region; using said second function equation for obtaining reference coordinates of said semiconductor wafer and coordinates of the respective exposure objective unit regions of said second region; and aligning said complementary divided mask based on said reference coordinates of said semiconductor wafer and said coordinates of exposure objective unit region of said second region, and exposing regions.

\* \* \* \* \*